(12) United States Patent
Nickel et al.

(10) Patent No.: US 8,610,439 B2
(45) Date of Patent: Dec. 17, 2013

(54) RADIO-FREQUENCY TEST PROBES WITH INTEGRATED MATCHING CIRCUITRY FOR TESTING TRANSCEIVER CIRCUITRY

(75) Inventors: Joshua G. Nickel, San Jose, CA (US); Robert W. Schlub, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 335 days.

(21) Appl. No.: 13/086,670

(22) Filed: Apr. 14, 2011

(65) Prior Publication Data

US 2012/0262188 A1    Oct. 18, 2012

(51) Int. Cl.
*G01R 27/04* (2006.01)
*G01R 27/00* (2006.01)

(52) U.S. Cl.
USPC .......................................... 324/629; 324/600

(58) Field of Classification Search
None
See application file for complete search history.

(56) References Cited

U.S. PATENT DOCUMENTS

| | | | |
|---|---|---|---|
| 5,457,399 A * | 10/1995 | Krumm | 438/11 |
| 5,577,269 A | 11/1996 | Ludewig | |
| 5,710,984 A * | 1/1998 | Millar et al. | 455/80 |
| 6,469,673 B2 | 10/2002 | Kaiponen | |
| 6,943,739 B1 | 9/2005 | Rousu et al. | |
| 7,020,443 B2 | 3/2006 | Talvitie et al. | |
| 2006/0234634 A1 | 10/2006 | Agnus et al. | |
| 2009/0146891 A1 | 6/2009 | Chen | |
| 2011/0003564 A1 | 1/2011 | Descombes et al. | |
| 2011/0039504 A1 | 2/2011 | Nguyen et al. | |
| 2011/0237199 A1 * | 9/2011 | Venkataraman et al. | 455/67.11 |
| 2012/0262188 A1 * | 10/2012 | Nickel et al. | 324/629 |

OTHER PUBLICATIONS

Nickel et al., U.S. Appl. No. 13/163,242, filed Jun. 17, 2011.
Nickel et al., U.S. Appl. No. 13/103,892, filed May 9, 2011.

* cited by examiner

*Primary Examiner* — Vinh Nguyen
(74) *Attorney, Agent, or Firm* — Treyz Law Group; Jason Tsai (57) ABSTRACT

Wireless electronic devices include wireless communications circuitry such as transceiver circuitry coupled to an antenna resonating element. The transceiver circuitry and the antenna element may be formed on first and second substrates, respectively. In compact wireless devices, transceiver and antenna matching circuits may be formed on the first substrate. During production testing, a radio-frequency test probe with integrated matching circuitry may be used to mate with a corresponding contact point on the first substrate. The integrated matching circuitry may include resistors, capacitors, and inductors soldered in desired series-parallel configurations within the test probe. When the test probe is mated to the contact point on the first substrate, a test unit connected to the test probe may be used to perform radio-frequency measurements to determine whether the transceiver circuitry satisfies design criteria.

10 Claims, 8 Drawing Sheets

RADIO-FREQUENCY TEST PROBES WITH INTEGRATED MATCHING CIRCUITRY FOR TESTING TRANSCEIVER CIRCUITRY

BACKGROUND

This relates to testing and, more particularly, to testing of electronic device structures.

Electronic devices such as computers, cellular telephones, music players, and other electronic equipment are often provided with wireless communications circuitry. In a typical configuration, the wireless communications circuitry includes a radio-frequency transceiver, a transceiver matching circuit, an antenna matching circuit, a switch connector, and an antenna connector each of which is mounted on a printed circuit board. The wireless communications circuitry also includes an antenna. The antenna includes an antenna resonating element that is coupled to the transceiver through the antenna connector or other coupling mechanism (i.e., via a screw or a spring).

The switch connector is connected between the transceiver and the antenna resonating element. During normal device operation, the switch connector serves to electrically connect the transceiver to the antenna resonating element so that radio-frequency signals can be conveyed between the transceiver and the antenna. During production testing, a radio-frequency test probe is mated with the switch connector to decouple the antenna from the transceiver during conducted test of the transceiver. The antenna resonating element is typically decoupled from the printed circuit board during conducted test. The test probe is connected to a test box such as a vector network analyzer through a coaxial cable. Radio-frequency test signals can be conveyed between the vector network analyzer and the transceiver when performing desired radio-frequency testing and calibration operations.

To satisfy consumer demand for small form factor wireless devices, manufacturers are continually striving to implement wireless communications components using compact structures. As device size continues to decrease, there may be insufficient space for the placement of the switch connector on the printed circuit board. To test the transceiver in the absence of the switch connector, the transceiver may be accessed via the antenna connector (with the antenna disconnected from the printed circuit board). If, however, the antenna resonating element is decoupled from the antenna connector and the antenna matching circuit is connected in series between the transceiver and the antenna connector on the printed circuit board, the test probe connected to the antenna connector will not see a 50 ohm impedance looking toward the transceiver.

In view of these considerations, it would be desirable to provide improved ways for testing wireless transceiver circuitry.

SUMMARY

Electronic devices may include wireless transceiver circuitry and antenna circuitry. The wireless transceiver circuitry may include cellular telephone transceiver circuitry, wireless local area network transceiver circuitry, satellite navigation systems transceiver circuitry, and other wireless communications circuitry. The antenna circuitry may include at least one antenna resonating element associated with a loop antenna, inverted-F antenna, strip antenna, planar inverted-F antenna, slot antenna, hybrid antenna that includes antenna structures of more than one type, or other suitable antennas.

The transceiver circuitry may be mounted on a substrate (e.g., a printed circuit board), whereas the antenna resonating element may be formed as a separate conductive element. The printed circuit board on which the transceiver circuitry is formed may sometimes be referred to as a main logic board. The transceiver circuit and the antenna resonating element may be connected at opposing ends of a transmission line path. The antenna resonating element may be coupled to the transceiver circuitry through first and second antenna connectors. The first antenna connector may be formed on the printed circuit board, whereas the second antenna connector may be formed on the antenna resonating element. During normal operation, the first and second antenna connectors are mated to allow radio-frequency signals to be conveyed between the transceiver circuitry and the antenna circuitry. The antenna resonating element need not be coupled to the printed circuit board through a radio-frequency connector. If desired, the antenna resonating element may be coupled to the printed transceiver circuitry via a spring, a screw, a shorting conductor, or other coupling mechanisms.

Transceiver matching circuitry may be formed on the printed circuit board to provide desired termination impedance for the transceiver circuitry. Antenna matching circuitry may also be formed on the printed circuit board in series between the transceiver circuitry and the first antenna connector to provided desired matching for the antenna resonating element (e.g., so that the antenna resonating element is matched with the transceiver circuitry during normal wireless transmission).

In one suitable test arrangement, a jumper (sometimes referred to as a removable coupling circuit) may be interposed in the signal path between the transceiver circuitry and the antenna. The jumper may be removed to decouple the antenna from the transceiver circuitry so that test equipment will see a desired 50 ohm impedance looking into the transceiver circuitry (as an example). Signal and ground test pads may be formed on the printed circuit board between the transceiver circuitry and the jumper. The signal test pad may tap into the signal path of the transceiver circuitry, whereas the ground test pad is shorted to ground. A pogo pin test probe may make contact with the test pads. A test unit to which the pogo pin test probe is connected may be used to make desired radio-frequency measurements on the transceiver circuitry during production testing (e.g., the pogo pin test probe will see 50 ohms looking into the transceiver circuitry).

In another suitable test arrangement, a coaxial test probe may be mated with the first antenna connector during transceiver testing/calibration. In this embodiment, jumpers and test pads need not be present on the printed circuit board. The coaxial test probe may include integrated matching circuitry. For example, the coaxial test probe may include an inner signal conductor and a surrounding shielding ground conductor. The integrated matching circuitry may include passive surface mount components such as capacitors, inductors, and resistors soldered in parallel between the signal and ground conductors and soldered in series along the signal conductor. The integrated test probe matching circuitry allows the test unit to be properly matched to the device structures under test even if the antenna matching circuitry is present in the transmission line path between the first antenna connector (or other coupling mechanism) and the transceiver circuitry. Test probes with integrated matching circuitry need not be used if the antenna matching circuitry can be decoupled from the transceiver circuitry during wireless testing.

In another suitable test arrangement, a pogo pin test probe with integrated matching circuitry may make contact with signal and ground test pads formed on the printed circuit board. Jumpers need not be used with test probes having integrated matching circuitry. For example, the pogo pin test probe may include an inner signal conductor and a surrounding tubular ground conductor. The integrated matching circuitry may include passive surface mount components such as capacitors, inductors, and resistors soldered in parallel between the signal and ground conductors and soldered in series along the signal conductor. If desired, test probes with integrated matching circuitry may be used to testing any number of antennas on a wireless electronic device.

Further features of the present invention, its nature and various advantages will be more apparent from the accompanying drawings and the following detailed description.

DETAILED DESCRIPTION

Wireless electronic devices include antenna and transceiver circuitry that support wireless communications. Examples of wireless electronic devices include desktop computers, computer monitors, computer monitors containing embedded computers, wireless computer cards, wireless adapters, televisions, set-top boxes, gaming consoles, routers, and other electronic equipment. Examples of portable wireless electronic devices include laptop computers, tablet computers, handheld computers, cellular telephones, media players, and small devices such as wrist-watch devices, pendant devices, headphone and earpiece devices, and other miniature devices.

Devices such as these are often provided with wireless communications capabilities. For example, electronic devices may use long-range wireless communications circuitry such as cellular telephone circuitry to communicate using cellular telephone bands at 850 MHz, 900 MHz, 1800 MHz, and 1900 MHz (e.g., the main Global System for Mobile Communications or GSM cellular telephone bands). Long-range wireless communications circuitry may also handle the 2100 MHz band.

Electronic devices may use short-range wireless communications links to handle communications with nearby equipment. For example, electronic devices may communicate using the WiFi® (IEEE 802.11) bands at 2.4 GHz and 5 GHz and the Bluetooth® band at 2.4 GHz. It is sometimes desirable to receive satellite navigation system signals such as signals from the Global Positioning System (e.g., to receive GPS signals at 1575 MHz).

Figure 1:
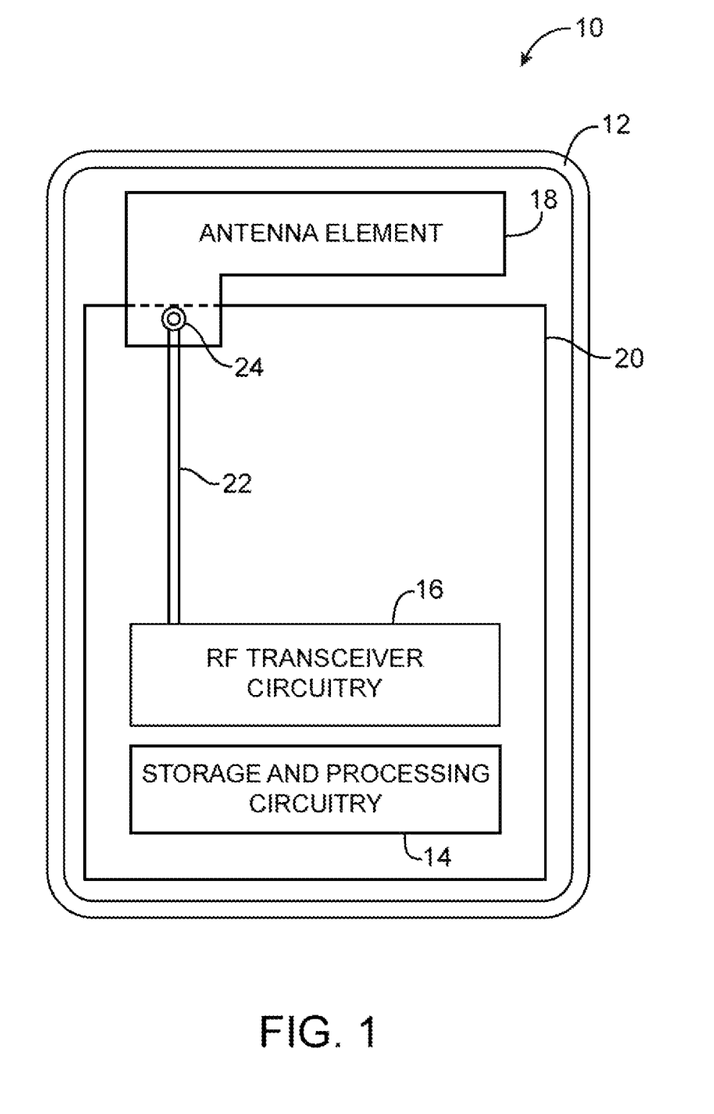
FIG. 1 is a diagram of an illustrative electronic device containing wireless communications circuitry in accordance with an embodiment of the present invention.

FIG. 1 is a diagram of an exemplary wireless electronic device. As shown in FIG. 1, device 10 may have a device housing such as housing structure 12 that forms a case for its associated components. Housing 12 may be formed from plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from conductive elements (e.g., a conductive peripheral bezel member).

Device 10 may include within its housing at least one antenna having an associated antenna resonating element 18, radio-frequency (RF) transceiver circuitry 16, storage and processing circuitry 14, input-output devices, and other electronic components. Transceiver circuitry 16 may be coupled to antenna element 18 through a corresponding pair of antenna connectors 24 (sometimes referred to as coupling members or coupling elements). Coupling element 24 need not be a radio-frequency connector. If desired, element 24 may be a screw, spring, or other suitable types of conductive structures.

Storage and processing circuitry 14, transceiver circuitry 16, and a first antenna connector 24 in the corresponding antenna connector pair may be mounted on a substrate such as printed circuit board (PCB) 20. Printed circuit board 20 may be, for example, a rigid printed circuit board formed from fiberglass-filled epoxy (e.g., FR-4) or may be a flexible printed circuit ("flex circuit") formed from a sheet of polymer such as a polyimide sheet. Printed circuit board 20 may, if desired, be mounted to housing structure 12.

Storage and processing circuitry 14 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 14 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 14 may be used to run software on device 10, such as internet browsing applications, voice-over-internet-protocol (VOIP) telephone call applications, email applications, media playback applications, operating system functions, etc. To support interactions with external equipment, storage and processing circuitry 14 may be used in implementing communications protocols. Communications protocols that may be implemented using circuitry 14 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Radio-frequency transceiver circuitry (sometimes referred to as radio circuitry) 16 may include satellite navigation system receiver circuitry for receiving satellite positioning signals at 1575 MHz, wireless local area network (WLAN) circuitry for handling the 2.4 GHz and 5 GHz WiFi® (IEEE 802.11) communications bands and the 2.4 GHz Bluetooth® communications band, cellular telephone circuitry for handling telephone bands such as bands at 850 MHz, 900 MHz, 1800 MHz, 1900 MHz, and 2100 MHz, and other suitable types of transceiver circuitry.

Conductive traces 22 may be used to form a transmission line (e.g., a microstrip transmission line, a stripline transmission line, an edge coupled microstrip or stripline transmission line, etc.) through which radio-frequency signals can be conveyed between transceiver 16 and antenna element 18. The example of FIG. 1 in which conductive traces 22 in printed circuit board 20 are used in forming a transmission line path coupled between transceiver 16 and the antenna is merely illustrative. If desired, one or more segments of coaxial cable may be incorporated within transmission line path 22.

Antenna element 18 may include antenna resonating element conductive structures. Antenna element 18 may form at least a portion of a loop antenna, inverted-F antenna, strip antenna, planar inverted-F antenna, slot antenna, hybrid antenna that includes antenna structures of more than one type, or other suitable antennas. The conductive structures may, if desired, be formed from portions of housing structure 12. The conductive structures may also include patterned metal traces formed on a substrate such as a plastic support structure, a rigid printed circuit board, or a flex circuit. The conductive structures on antenna element 18 may be coupled to a second antenna connector 24 in the corresponding antenna connector pair. First and second connectors 24 may be, for example, male and female U.FL (or W.FL) connectors, respectively.

The wireless communications circuitry within housing 12 may be tested and calibrated during production of device 10. The components being tested and calibrated may sometimes be referred to as device structures under test. Device structures under test may include transceiver circuitry 16, antenna element 18, and other wireless communications circuitry. These device structures under test may neither be attached to one another nor completely assembled within housing 12 during production testing.

Figure 2:
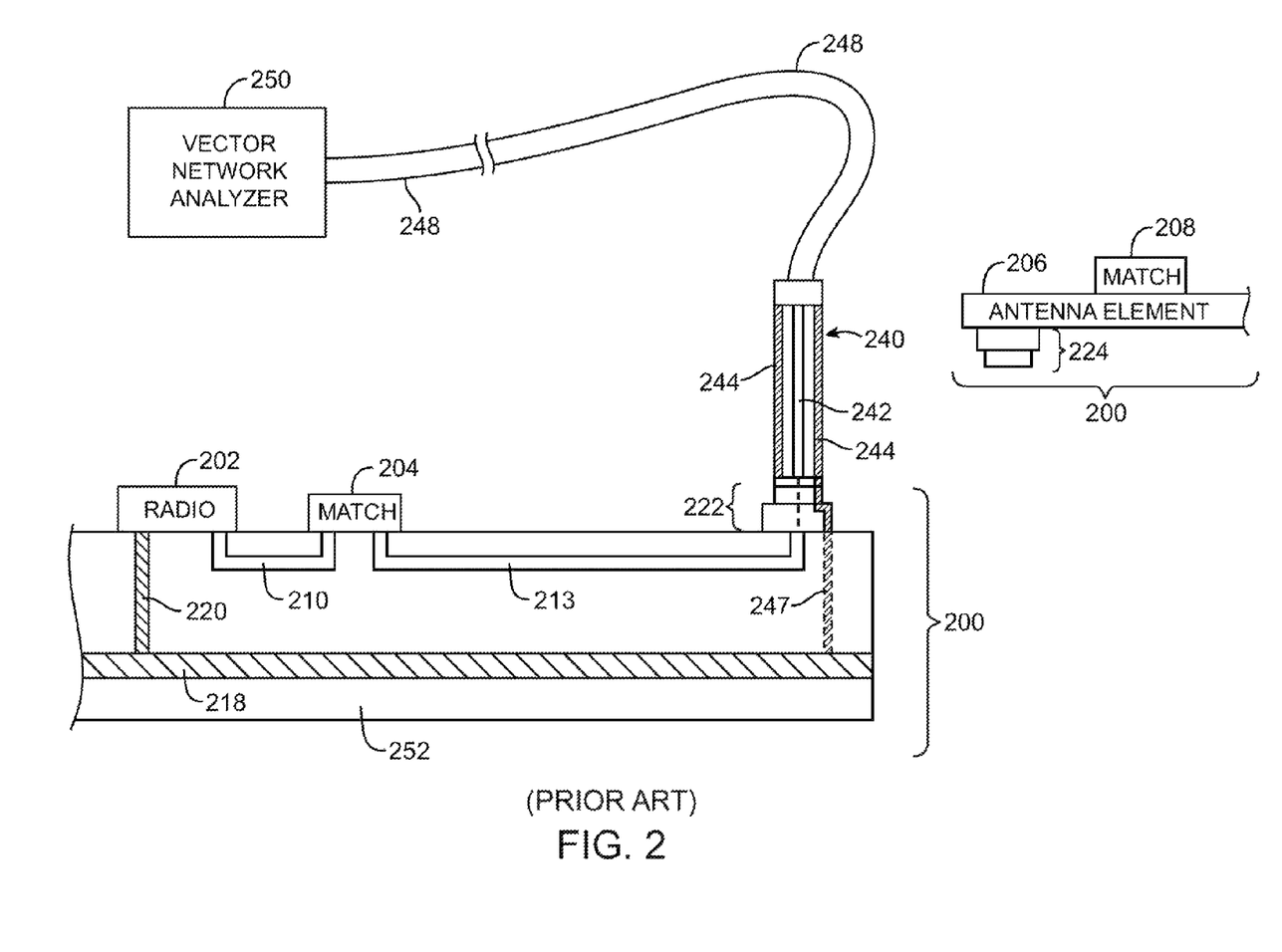
FIG. 2 is a diagram of a conventional test setup for testing device structures.

FIG. 2 is a diagram showing a conventional test setup for testing device structures under test 200. Structures 200 include transceiver 202, transceiver matching circuit 204, and first antenna connector 222 mounted on printed circuit board 252. Structures 200 also include antenna resonating element 206 that is disconnected from first antenna connector 222 (i.e., second antenna connector 224 on antenna element 206 is not mated with corresponding first antenna connector 222). Antenna matching circuit 208 is connected to antenna element 206.

Ground power supply line 218 is formed in printed circuit board 252. Transceiver 202 has a terminal that is connected to ground line 218 through via 220. Transceiver 202 is electrically coupled to antenna connector 222 through conductive paths 210 and 213. Transceiver matching circuit 204 is connected in parallel with transceiver 202.

During testing, a vector network analyzer (VNA) 250 is used to perform radio-frequency testing on transceiver 202. Vector network analyzer 250 is coupled to a coaxial test probe 240 through coaxial cable 248. In particular, coaxial cable 248 has a first end that is mated to a corresponding input-output port in vector network analyzer 250 and a second end that is connected to test probe 240. Test probe 240 is a female U.FL connector.

Test probe 240 includes an inner signal conductor 242 surrounded by an outer tubular ground conductor 244. Signal conductor 242 and ground conductor 244 share the same geometric axis and are separated by a tubular dielectric layer. When test probe 240 is mated with antenna connector 222, signal conductor 244 is electrically connected to conductive path 213, whereas ground conductor 244 is electrically connected to ground line 218 through via 247.

Connected in this arrangement, radio-frequency test signals can be conveyed back and forth between vector network analyzer 250 and transceiver 202. Based on radio-frequency test measurements gathered using vector network analyzer 250, transceiver 202 is marked as satisfying performance criteria or as failing performance criteria.

Transceiver matching circuit 204 serves to provide a 50 ohm impedance for test probe 240 during transceiver testing (i.e., test probe 240 "sees" 50 ohms looking into antenna connector 222). Antenna matching circuit 208 serves to provide matching for antenna element 206. In the conventional device configuration of FIG. 2, antenna matching circuit 208 is formed as a part of antenna element 206 and may therefore be decoupled from the wireless circuitry on board 252 during transceiver testing (i.e., by disconnecting antenna element 206 from PCB 252).

As manufacturers push towards more compact antenna designs, it may be necessary to form the antenna matching circuit on the printed circuit board. In the circuit shown in FIG. 2, if antenna matching circuit 208 is formed on printed circuit board 252, test probe 240 will no longer be properly matched when test probed 240 is mated with antenna connector 222 (i.e., antenna matching circuit 208 will alter the 50 ohm impedance previously provided by transceiver matching circuit 204). It may therefore be desirable to provide an improved arrangement for testing wireless communications circuitry for antenna designs in which the antenna matching network cannot be decoupled from the radio-frequency transceiver during testing.

Figure 3:
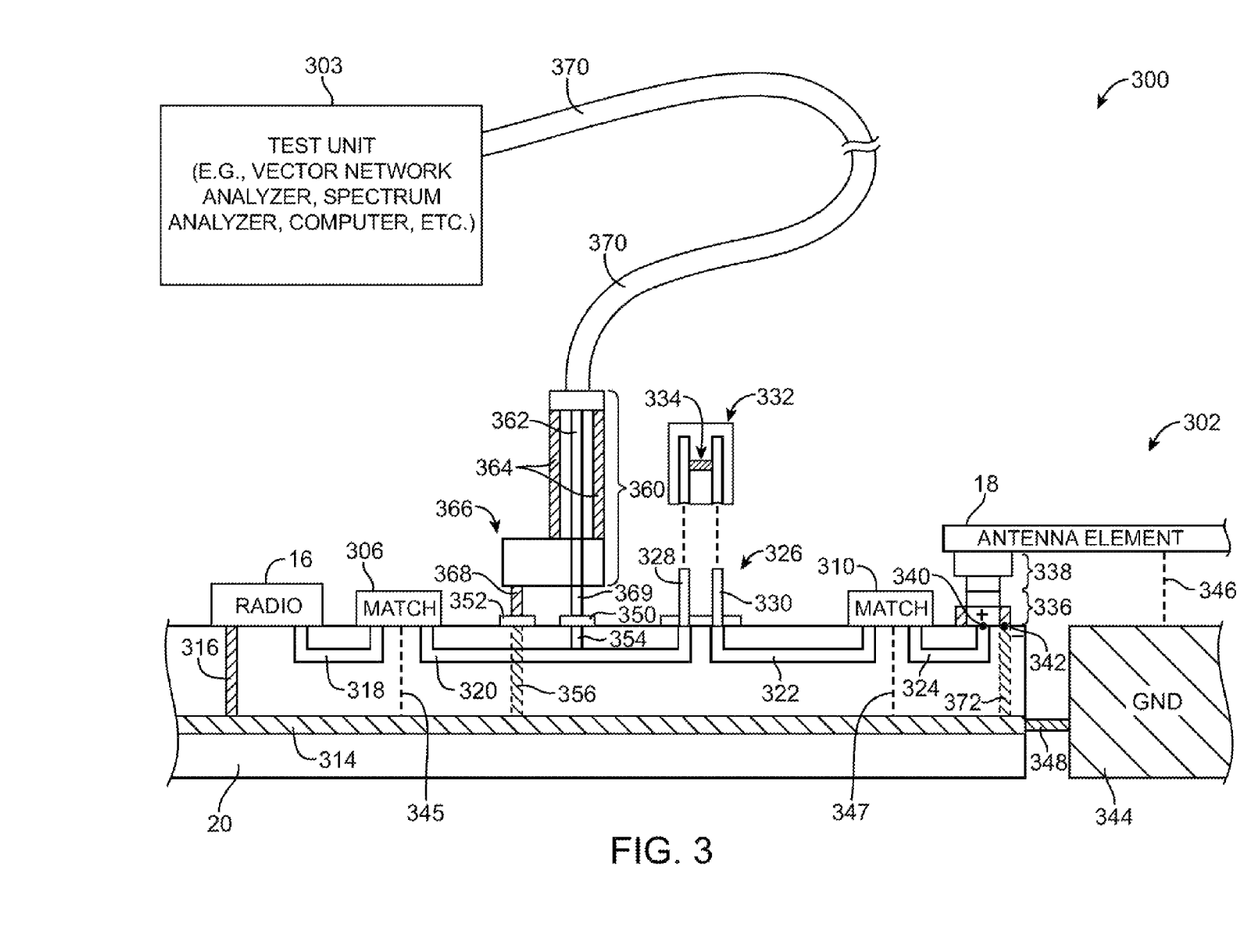
FIG. 3 is a diagram of illustrative device structures under test that include radio-frequency transceiver circuitry, an antenna resonating element, and a jumper circuit coupled between the transceiver circuitry and the antenna resonating element in accordance with an embodiment of the present invention.

FIG. 3 is a diagram showing one exemplary arrangement for performing transceiver testing and calibration. As shown in FIG. 3, device structures under test 302 may include RF transceiver circuitry (or radio transceiver circuitry) 16, transceiver matching circuit 306, antenna matching circuit 310, antenna connector 336, and other wireless communications circuitry formed on substrate (e.g., a printed circuit board, a flex circuit, a rigid-flex, or other suitable substrates).

Structures 302 may also include antenna resonating element 18 and ground plane structure 344. Antenna element 18 may have an associated antenna connector 338 that can be used to mate with corresponding antenna connector 336 (e.g., antenna element 18 may be removably coupled to the second end of the transmission line path). Ground structure 344 may be formed from portions of housing structure 12 or other conductive components within housing 12. Ground structure 344 may be coupled to antenna element 18 through conductive path 346. Ground structure 244 may be coupled to ground path 314 in printed circuit board (PCB) 20 through conductor 348. Conductors 346 and 348 may include shorting inductors, springs, screws, metal traces, coaxial cabling, or other conductive parts and may therefore sometimes be referred to as coupling members.

Transceiver circuitry 16 may have a ground terminal coupled to ground path 314 through via 316 (e.g., a conductive through-hole in PCB 20). Transceiver circuitry 16 may be coupled to antenna connector 336 through a transmission line path that includes at least conductive paths 318, 320, 322, and 324. The transmission line path may, for example, include one or more conductive traces formed in at least one signal routing layer in PCB 20, one or more coaxial cable segments, or other suitable radio-frequency signal conduits.

Antennas in device 10 may have antenna feed terminals. For example, antenna element 18 may have a first antenna feed terminal such as positive antenna feed terminal 340 and a second antenna feed terminal such as ground antenna feed terminal 342. Ground antenna feed terminal 342 may be shorted to ground path 314 through via 372. Transmission line 324 may be used to feed antenna resonating element 18 at positive and negative antenna feed terminals 340 and 342, respectively. Antenna resonating element 18 need not be coupled to printed circuit board 20 through antenna connectors. If desired, positive and negative antenna feeds 340 and 342 may be electrically coupled to antenna element 18 through springs, screws, conductive pads formed on flex circuits, or other conductive means.

The transmission line path coupling transceiver circuitry 16 to antenna connector 336 may have first and second ends. Transceiver circuitry 16 may be connected to the first end of the transmission line path with transceiver matching circuit 306 (e.g., circuit 306 may be coupled in parallel with transceiver circuitry 16) and may serve to provide a 50 ohm impedance matching for circuitry 16. Antenna connector 336 may be connected to the second end of the transmission line path with antenna matching circuit 310 (e.g., circuit 310 may be coupled in series between transceiver circuitry 16 and antenna connector 336) and may serve to provide proper matching for antenna element 18 during normal operation of device 10 (e.g., to ensure that the antenna is properly matched with transceiver circuitry 16). Matching circuits 306 and 310 may be coupled to ground, as indicated by shorting paths 345 and 347. Matching circuits 306 and 310 may sometimes be referred to as impedance matching networks and may provide termination impedance values other than 50 ohms, if desired. Matching circuits 306 and 310 may include any number of electrical components (e.g., discrete and/or integrated capacitors, inductors, and resistors) coupled in any suitable series-parallel configuration in the transmission line path between circuitry 16 and connector 336.

A removable coupling circuit such as a jumper circuit 326 may be interposed in the signal path between transceiver circuitry 16 and antenna element 18. Jumper circuit 326 may include first jumper pin 328 and second jumper pin 330. First jumper pin 328 may be coupled to transceiver circuitry 16, whereas second jumper pin 330 may be coupled to antenna element 18. A conductive sleeve (sometimes referred to as a jumper shunt) 332 may be mated with jumper pins 328 and 330. For example, jumper shunt 332 may include a plastic block having two pin holes corresponding to jumper pins 328 and 330. Jumper 332 may also include shorting conductor 334 that electrically connects pins 328 and 330 when jumper 332 is in the mated state.

Jumper 332 is placed in the mated state during normal device operation, whereas jumper 332 may be removed during transceiver testing. In the absence of a switch connector, jumper circuit 336 provides one way of decoupling the antenna from transceiver circuitry 16.

As shown in FIG. 3, test station 300 may include a test unit such as test unit 303 that can be used to perform desired radio-frequency performance measurements on device structures under test 302. Test unit 303 may include signal generator equipment that generates radio-frequency signals over a range of frequencies. These generated signals may be provided to test probe 360 over radio-frequency cable 370 (e.g., a coaxial cable).

Test unit 303 may also include radio-frequency receiver circuitry that is able to gather wireless performance information for incoming signals (i.e., radio-frequency signals that are received through test probe 360). With one suitable arrangement, test unit 303 may be a vector network analyzer and a computer that is coupled to the vector network analyzer for gathering and processing test results. Tester 303 may, for example, be the CMU300 Universal Radio Communication Tester available from Rohde & Schwarz. This is, however, merely illustrative. Test unit 303 may be a radio communications tester of the type that is used to perform radio-frequency signaling tests for a variety of different radio-frequency communications bands and channels (e.g., test unit 303 may be a spectrum analyzer, a power meter, a wireless protocol tester, etc.).

Test unit 303 may include a transmitter and a receiver that can be used to transmit and receive radio-frequency signals to and from device structures 302. The transmitted and received signals may be processed to compute complex impedance data (sometimes referred to as S11 parameter data), complex forward transfer coefficient data (sometimes referred to as S21 data), or other suitable data for determining whether device structures 302 satisfy design criteria.

Test probe 360 may include a tubular ground conductor 364 that forms a bore through which an inner signal conductor is concentrically located. Test probe 360 may also include pin support member 366. Pin support member 366 (sometimes referred to as a front plunger) may serve to hold signal pin 369 and ground pin 368 in a way such that the distance between pins 369 and 368 is fixed at a desired distance. Signal pin 369 may be connected to signal conductor 362, whereas ground pin 368 may be connected to ground conductor 364. At least one of pins 368 and 369 may be a spring-loaded pin. Test probe 360 of this type may sometimes be referred to as a pogo pin test probe.

During testing of transceiver circuitry 16, test pins 369 and 368 may respectively make contact with conductive test pads 350 and 352 formed on the surface of PCB 20. Signal test pad 350 may tap into the signal path (e.g., conductive pad 350 may be coupled to the transceiver signal path through via 354), whereas ground test pad 352 may be shorted to ground 314 through via 356.

Removing jumper 332 allows test unit 303 to properly communicate with radio-frequency transceiver circuitry 16 through test probe 360 whether or not antenna element 18 is connected to printed circuit board 20. Test probe 360 will see a desired 50 ohm impedance (e.g., or any other impedance provided by transceiver matching circuit 306) looking into circuitry 16 if jumper 332 is removed to decoupled the loading from antenna element 18 and antenna matching circuit 310 (e.g., removing coupling circuit 332 from the transmission line path isolates the test pads from the antenna impedance matching circuit 310).

Figure 4:
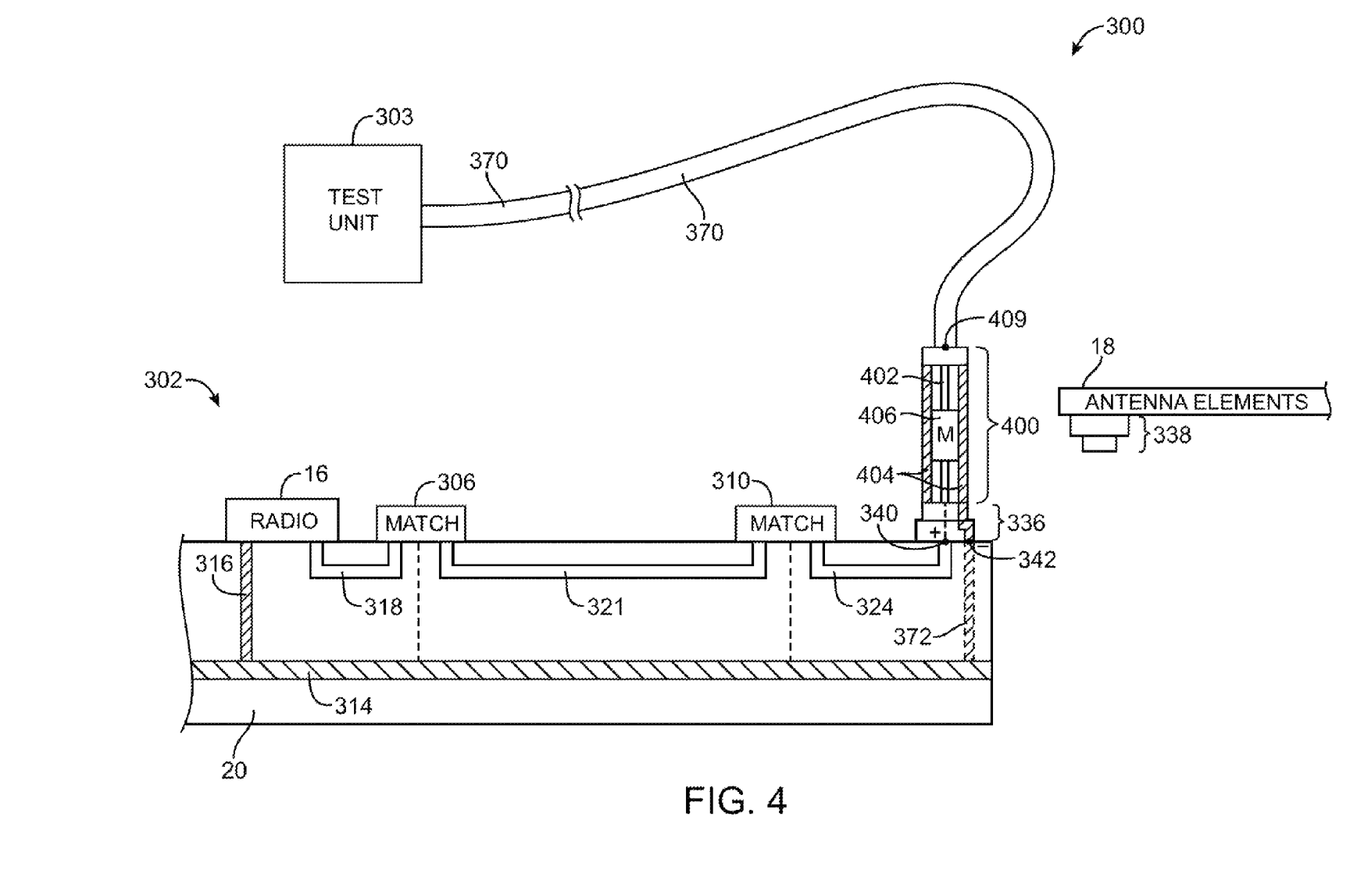
FIGS. 4 and 5 are diagrams of illustrative test stations each having a radio-frequency test probe with integrated matching circuitry in accordance with an embodiment of the present invention.

There may not always be sufficient space to form jumper circuit 326 on printed circuit board 20. In scenarios in which the jumper circuit is absent from device structures 302, test unit 302 may interface with transceiver circuitry 16 through antenna connector 336 (see, e.g., FIG. 4). As shown in FIG. 4, radio-frequency test signals may be conveyed between test unit 303 and transceiver circuitry 16 by mating radio-frequency test probe 400 with antenna connector 336. Test unit 303 and test probe 400 may be connected through coaxial cable 370 (as an example).

Antenna element 18 is disconnected from printed circuit board 20 (e.g., antenna element 18 is removed from connector 336) while test probe 400 is mated with antenna connector 336. Test probe 400 may include an inner signal conductor 402 surrounded by a cylindrical shielding ground conductor 404. Signal conductor 402 and ground conductor 404 may share a common geometric axis. Test probe 400 may be a type of test probe suitable for mating with a corresponding U.FL connector, W.FL connector, SubMiniature version A (SMA) connector, SubMiniature version B (SMB) connector, or other types of coaxial radio-frequency connectors. When test probe 400 is mated with antenna connector 336, signal conductor 402 may be coupled to positive antenna feed terminal 340, whereas ground conductor 404 may be coupled to negative antenna feed terminal 342.

A conventional coaxial test probe mated to antenna connector 336 of FIG. 4 will not see a 50 ohm impedance looking into transceiver circuitry 16 (e.g., a conventional coaxial test probe will not be properly matched to on-board components), because antenna matching circuit 310 that is coupled in series between transceiver circuitry 16 and antenna connector 336 provides loading in addition to the 50 ohm impedance provided by transceiver matching network 306.

One exemplary solution is illustrated in FIG. 4. As shown in FIG. 4, test probe 400 includes matching components 406 integrated within test probe 400. Matching components 406 may serve to compensate for the additional loading of antenna matching circuit 310 when gathering the radio-frequency test measurements through antenna connector 336. Matching components 406 may include surface mount resistors, capacitors, inductors, integrated impedance matching circuits, and other electrical components coupled in any desired series-parallel configuration. Using a radio-frequency test probe with integrated matching circuitry may allow the test equipment to be properly matched to transceiver circuitry 16 even if antenna matching circuit 310 is coupled in series with antenna connector 336 (e.g., the test equipment will see 50 ohms looking into the radio from reference point 409).

Figure 5:
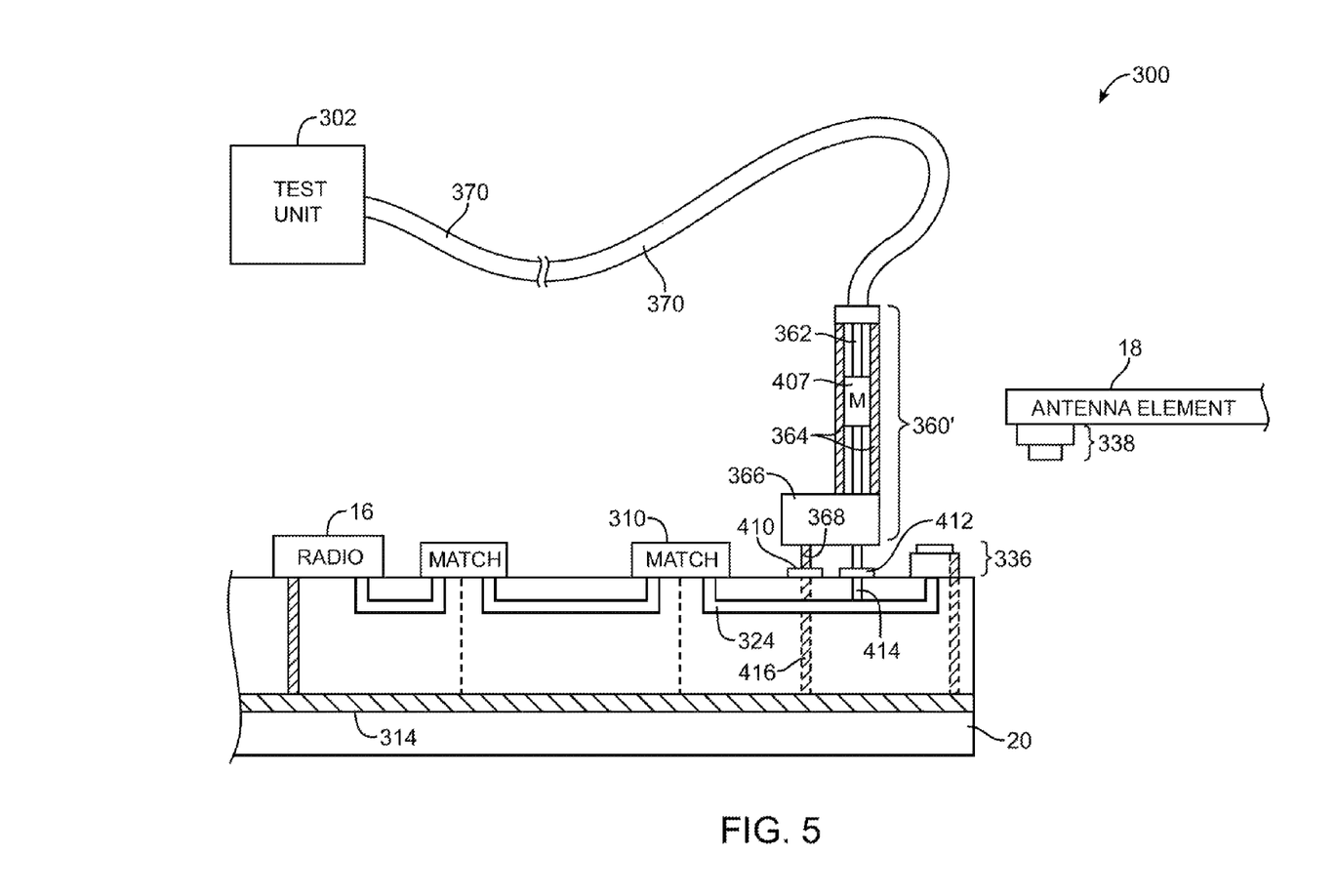

In another suitable arrangement, signal and ground test pads 412 and 410 may be formed on the surface of printed circuit board 20 (see, e.g., FIG. 5). As shown in FIG. 5, signal test pad 412 may be coupled to the transceiver signal path through via 414, whereas ground pad 410 may be coupled to ground path 314 through via 416. An RF test probe such as test probe 360' may make contact with pads 412 and 410 during transceiver testing operations. Test probe 360' may be a pogo pin test probe with integrated impedance matching circuitry 407. Matching components 407 may serve to compensate for the impedance of antenna matching circuit 310 when gathering the radio-frequency test measurements through test pads 412 and 410. Performing radio-frequency testing in this way allows the test equipment to communicate with transceiver circuitry 16 through an access point other than antenna connector 336.

FIG. 5 shows transceiver testing with antenna element 18 disconnected from printed circuit board 20. If desired, antenna element may be connected to printed circuit board 20 during transceiver testing and calibration operations. The configuration of test probe matching circuitry 407 may depend on whether antenna element 18 is coupled to printed circuit board 20 during testing, because antenna element 18 presents additional loading when antenna connector 338 is mated with antenna connector 336. For example, if antenna element 18 is coupled to board 20 during transceiver testing, test probe matching circuitry 407 will have a first configuration to provide proper impedance matching. If antenna element 18 is disconnected from board 20 during transceiver testing, test probe matching circuitry 407 will have a second configuration that is different than the first configuration to provide proper impedance matching.

Test stations 300 described in connection with FIGS. 4 and 5 are merely illustrative and are not intended to limit the scope of the present invention. If desired, radio-frequency test probes with integrated matching circuitry may be used to test any number of wireless transceiver circuitry and/or antennas in device 10 during device manufacturing processes.

Figure 6:
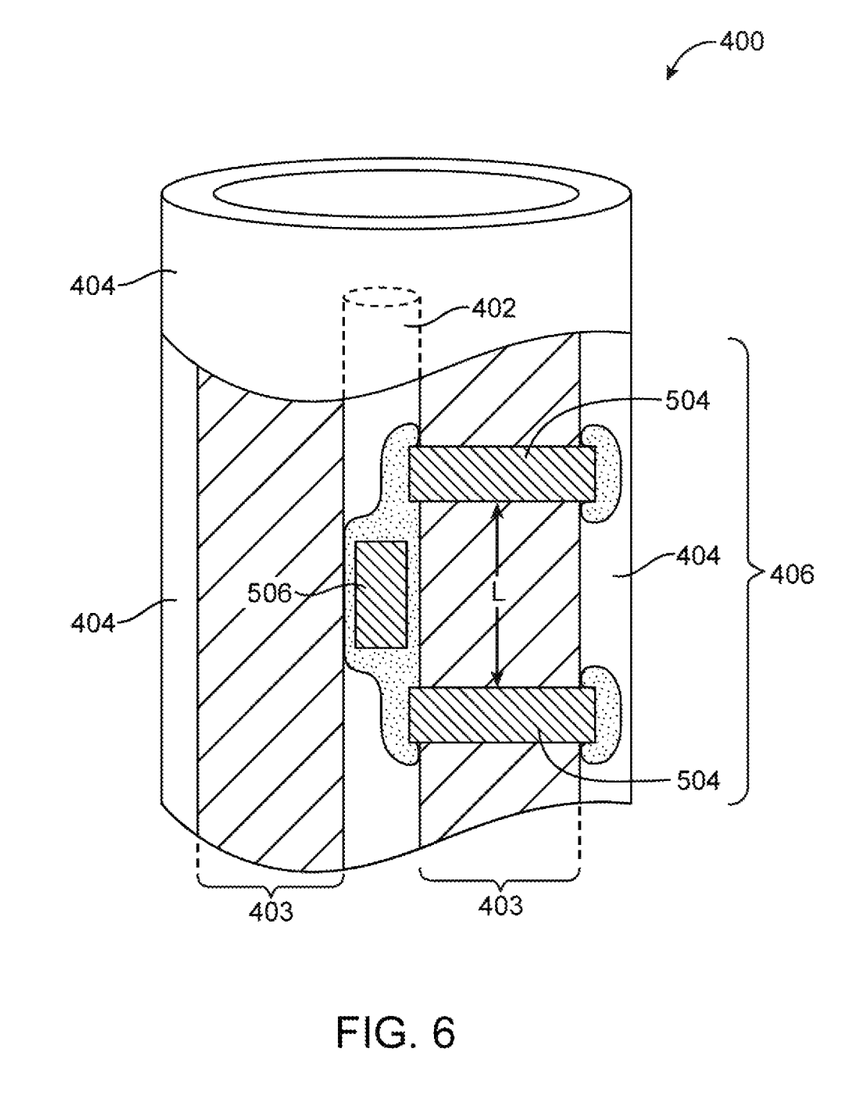
FIG. 6 is a diagram showing integrated matching components within the test probe of FIG. 4 in accordance with an embodiment of the present invention.

FIG. 6 shows a cross-sectional view of coaxial test probe 400 with integrated matching circuitry. As shown in FIG. 6, passive electrical components 504 may be soldered in parallel between inner signal conductor 402 and ground conductor 404. The portion of signal conductor 402 between two parallel-connected components 504 constitutes a transmission line having a length that is equal to a distance L between the two parallel-connected components 504. Distance L between components 504 may therefore be adjusted to provide desired impedance match. Passive electrical components 506 may be soldered in series along signal conductor 402. Circuits 504 and 506 may be surface mount resistors, capacitors, inductors, and other electrical components. If desired, any number of parallel and series components may be soldered within test probe 400 to provide desired matching. Non-conductive (dielectric) material 403 may be formed surrounding signal conductor 402 to insulate signal conductor 402 from ground conductor 404.

Figure 7:
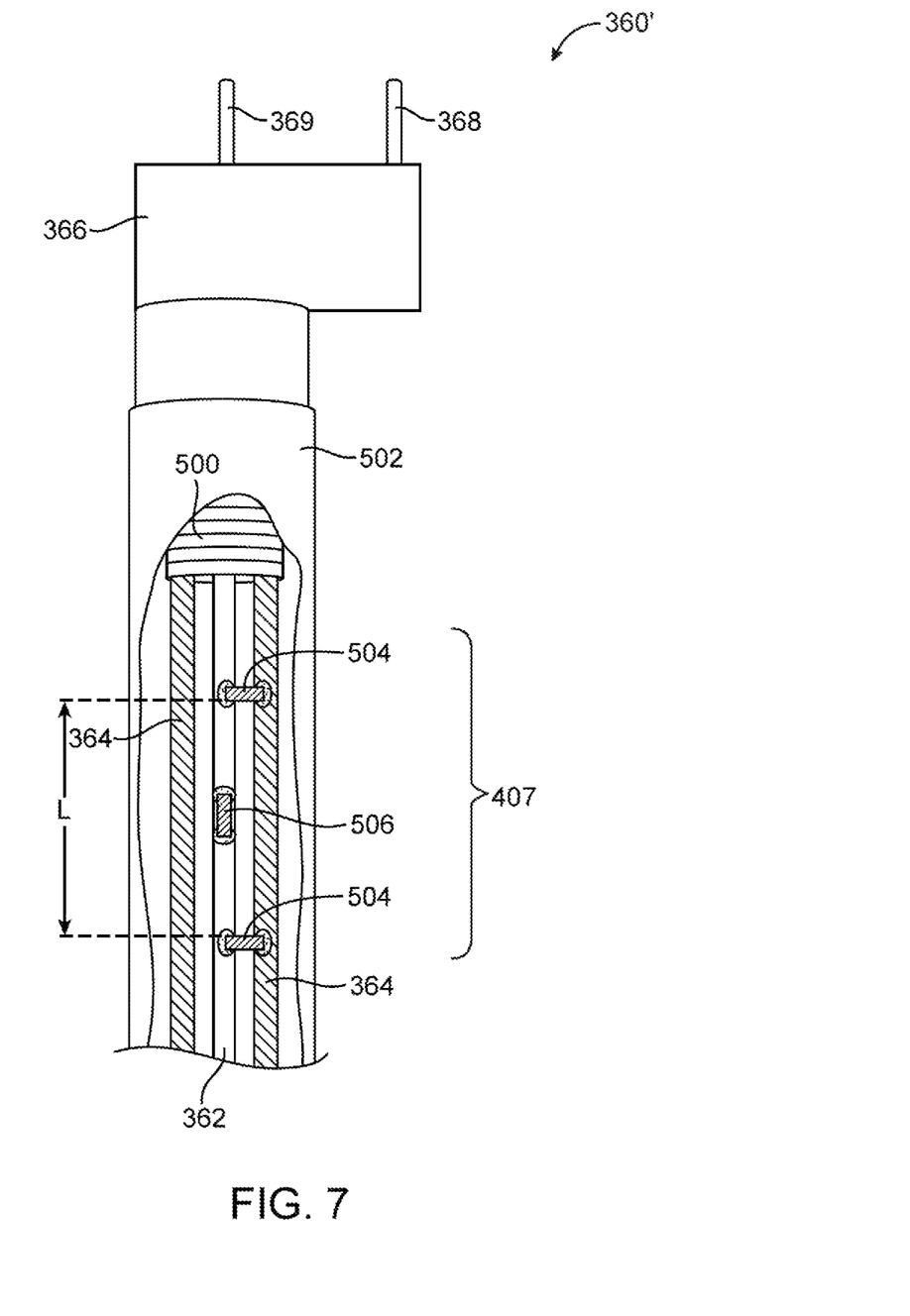
FIG. 7 is a diagram showing integrated matching components within the test probe of FIG. 5 in accordance with an embodiment of the present invention.

FIG. 7 shows a cross-sectional view of pogo pin test probe 360' with integrated matching circuitry 407. Signal and ground conductors 362 and 364 and spring member 500 may be encased within ground shaft 502. Spring member 500 may be interposed in the signal path between signal conductor 362 and signal pin 369 so that signal pin 369 can be depressed when making contact with a corresponding test pad during test procedures.

As shown in FIG. 6, passive electrical components 504 may be soldered in parallel between inner signal conductor 362 and ground conductor 364. The portion of signal conductor 362 between two parallel-connected components 504 constitutes a transmission line having a length that is equal to a distance L between the two parallel-connected components 504. Distance L between components 504 may therefore be adjusted to provide desired impedance match. Passive electrical components 506 may be soldered in series along signal conductor 362. Circuits 504 and 506 may be surface mount resistors, capacitors, inductors, and other electrical components. If desired, any number of parallel and series components may be soldered within test probe 360' to provide desired matching.

Coaxial test probes of the type described in connection with FIGS. 6 and 7 are merely illustrative and are not intended to limit the scope of the present invention. If desired, other types of radio-frequency test probes such as twin-lead cable test probes, twisted pair cable test probes, test probes having a matrix of spring-loaded (pogo) pins, or other types of transmission lines having at least two conductive paths may be used to perform conducted transceiver testing. Integrated matching components may be integrated into any of these test probes.

Figure 8:
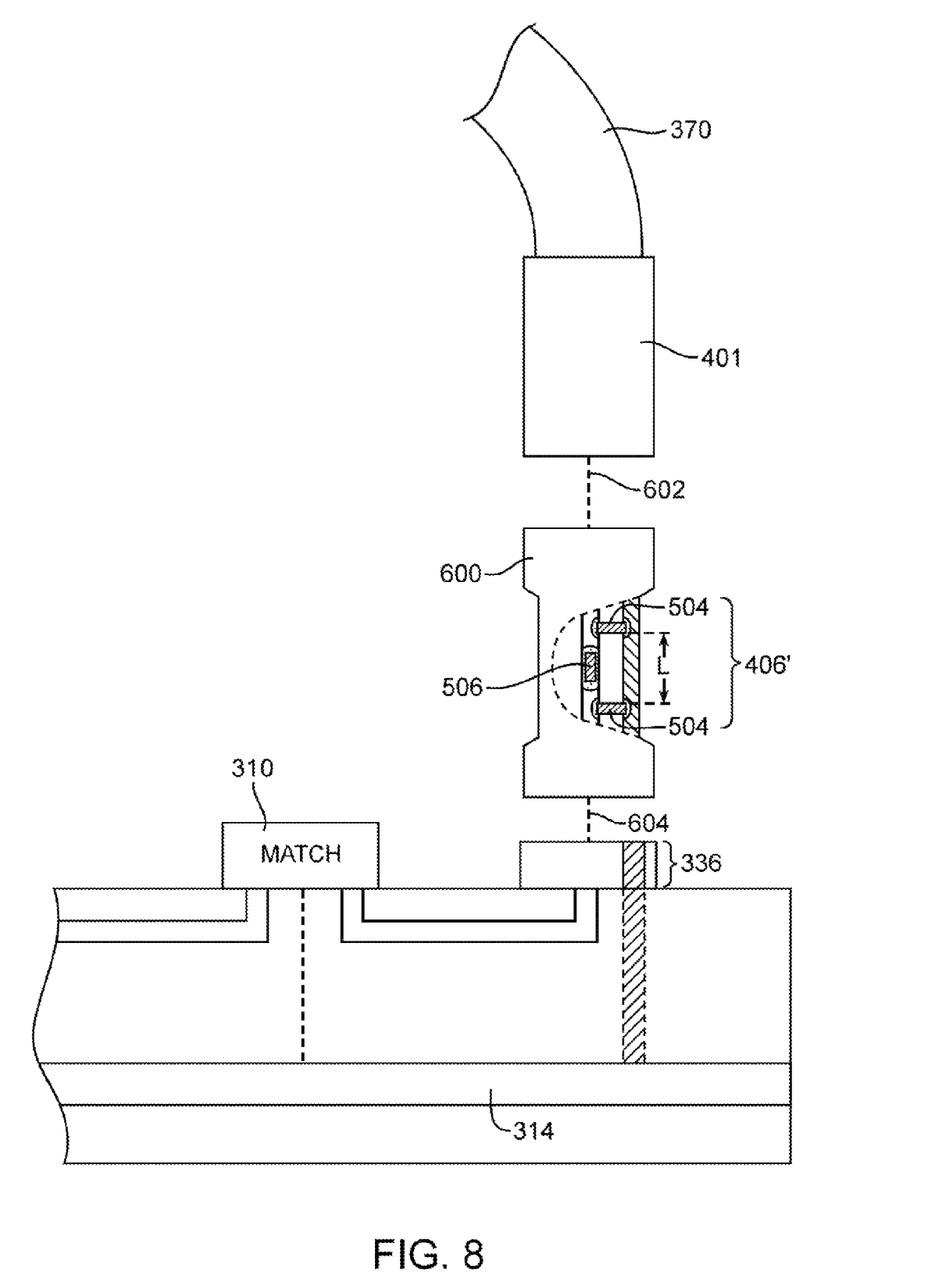
FIG. 8 is a diagram showing a coaxial adapter containing integrated matching components in accordance with an embodiment of the present invention.

Matching components need not always be formed in the radio-frequency test probes. In another suitable embodiment, an adapter such as radio-frequency adapter 600 may be interposed between antenna connector 336 and radio-frequency test probe 401. As shown in FIG. 8, adapter 600 (sometimes referred to as a coaxial barrel coupler) may include integrated impedance matching components 406' that can be used to compensate for the impedance of antenna matching circuit 310 (e.g., test probe 401 need not include integrated matching circuitry 406).

Adapter 600 may have a first end that can be connected to connector 336 (as indicated by line 604) and a second end that can be connected to test probe 401 (as indicated by line 602). Adapter 600 may be a male-to-male adapter, male-to-female adapter, or a female-to-female adapter suitable for coupling any type of antenna connector 336 (e.g., a U.FL connector) to any type of test probe 401 (e.g., an SMA connector).

The foregoing is merely illustrative of the principles of this invention and various modifications can be made by those skilled in the art without departing from the scope and spirit of the invention. The foregoing embodiments may be implemented individually or in any combination.

What is claimed is:

1. A method of testing device structures under test with test equipment that includes a test probe, wherein the device structures under test include a transmission line path, transceiver circuitry coupled to a first end of the transmission line path with a transceiver impedance matching circuit, an antenna resonating element removably coupled to a second end of the transmission line path through a coupling member, and an antenna impedance matching circuit in the transmission line path between the coupling member and the transceiver impedance matching circuit, the method comprising:

removing the antenna resonating element from the coupling member; and with a radio-frequency test probe, gathering radio-frequency test measurements through the coupling member while the antenna resonating element is removed from the coupling member.

2. The method defined in claim 1, wherein the test probe includes a test probe impedance matching circuit that compensates for the impedance of the antenna impedance matching circuit when gathering the radio-frequency test measurements through the coupling member.

3. The method defined in claim 1, wherein the test probe has positive and ground lines and at least one electrical component bridging the positive and ground lines.

4. The method defined in claim 3, wherein the test probe further comprises at least one additional electrical component connected in series along the positive line.

5. The method defined in claim 4, wherein the at least one electrical component and the at least one additional electrical component each comprise at least one component selected from the group consisting of: an inductor, a capacitor, and a resistor.

6. The method defined in claim 1, wherein the test equipment further comprises a test unit, and wherein gathering the radio-frequency test measurements comprises:

with the test unit, transmitting radio-frequency test signals to the test probe via a radio-frequency cable; and with the test unit, receiving corresponding reflected test signals via the radio-frequency cable.

7. The method defined in claim 6, wherein the test equipment further comprises a radio-frequency adapter that couples the radio-frequency cable to the coupling member, and wherein the radio-frequency adapter includes an adapter impedance matching circuit that compensates for the impedance of the antenna impedance matching circuit when gathering the radio-frequency test measurements through the coupling member.

8. The method defined in claim 7, wherein the test equipment further comprises a radio-frequency adapter that couples the radio-frequency cable to the coupling member, wherein the radio-frequency adapter has positive and ground conductors and at least one electrical component bridging the positive and ground conductors, and wherein the at least one electrical component comprises at least one component selected from the group consisting of: an inductor, a capacitor, and a resistor.

9. The method defined in claim 1, wherein coupling member comprises a conductive member selected from the group consisting of: a radio-frequency connector, a spring, and a screw.

10. The method defined in claim 1, wherein the device structures under test form part of a portable electronic device, and wherein the transceiver circuitry comprises a transceiver selected from the group consisting of: a cellular telephone transceiver, a wireless local area network transceiver, and a satellite navigation system receiver.

* * * * *